(12) United States Patent
Hertkorn et al.

(10) Patent No.: US 9,484,490 B2
(45) Date of Patent: Nov. 1, 2016

(54) EPITAXY SUBSTRATE, METHOD FOR PRODUCING AN EPITAXY SUBSTRATE AND OPTOELECTRONIC SEMICONDUCTOR CHIP COMPRISING AN EPITAXY SUBSTRATE

(71) Applicant: OSRAM Opto Semiconductors GmbH, Regensburg (DE)

(72) Inventors: Joachim Hertkorn, Alteglofsheim (DE); Alexander Frey, Regensburg (DE); Christian Schmid, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/397,175

(22) PCT Filed: Apr. 24, 2013

(86) PCT No.: PCT/EP2013/058477
§ 371 (c)(1),
(2) Date: Oct. 24, 2014

(87) PCT Pub. No.: WO2013/160343
PCT Pub. Date: Oct. 31, 2013

(65) Prior Publication Data
US 2015/0076507 A1      Mar. 19, 2015

(30) Foreign Application Priority Data

Apr. 26, 2012   (DE) .................. 10 2012 103 686

(51) Int. Cl.
*H01L 33/00* (2010.01)
*H01L 21/02* (2006.01)
(Continued)

(52) U.S. Cl.
CPC ....... *H01L 33/0066* (2013.01); *H01L 21/0251* (2013.01); *H01L 21/0254* (2013.01);
(Continued)

(58) Field of Classification Search
CPC .................. H01L 21/02488; H01L 31/1852; H01L 33/0066; H01L 33/007; H01L 33/0075
See application file for complete search history.

(56) References Cited

U.S. PATENT DOCUMENTS 5,741,724 A * 4/1998 Ramdani ............... H01L 33/007
117/89
6,692,568 B2   2/2004 Cuomo et al.
(Continued)

FOREIGN PATENT DOCUMENTS

CN    1706030 A    12/2005
CN    1747185 A    3/2006
(Continued)

OTHER PUBLICATIONS

Metzger, T. et al.: "Coherent X-Ray Scattering Phenomenon in Highly Disordered Epitaxial AlN Films", Phys. Status Solidi (a), vol. 162, No. 2, pp. 529-535, 1997.

*Primary Examiner* — Daniel Shook
(74) *Attorney, Agent, or Firm* — McDermott Will & Emery LLP

(57) ABSTRACT

An epitaxy substrate (11, 12, 13) for a nitride compound semiconductor material is specified, which has a nucleation layer (2) directly on a substrate (1) wherein the nucleation layer (2) has at least one first layer (21) composed of AlON with a column structure. A method for producing an epitaxy substrate and an optoelectronic semiconductor chip comprising an epitaxy substrate are furthermore specified.

17 Claims, 3 Drawing Sheets

Figure 1:
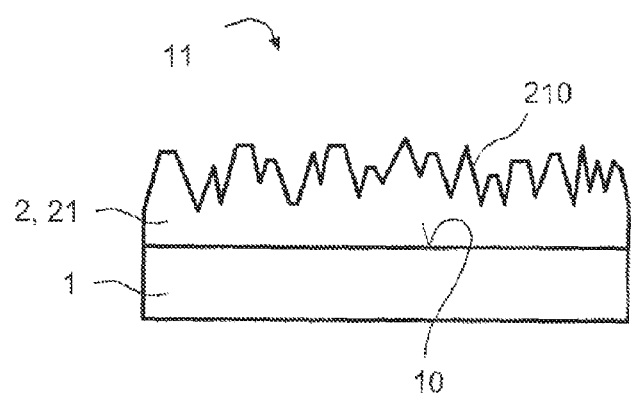

(51) Int. Cl.
*H01L 31/0304* (2006.01)
*H01L 31/18* (2006.01)
*H01L 33/32* (2010.01)

(52) U.S. Cl.
CPC ..... *H01L21/0262* (2013.01); *H01L 21/02458* (2013.01); *H01L 21/02488* (2013.01); *H01L 21/02502* (2013.01); *H01L 21/02513* (2013.01); *H01L 21/02661* (2013.01); *H01L 31/03044* (2013.01); *H01L 31/1852* (2013.01); *H01L 31/1856* (2013.01); *H01L 33/0075* (2013.01); *H01L 33/32* (2013.01); *Y10T 428/24355* (2015.01)

(56) References Cited

U.S. PATENT DOCUMENTS

| | | | |
|---|---|---|---|
| 2001/0009134 A1* | 7/2001 | Kim | C30B 25/02 117/8 |
| 2003/0176001 A1 | 9/2003 | Fukuyama et al. | |
| 2005/0059257 A1 | 3/2005 | Fukuyama et al. | |
| 2006/0051554 A1* | 3/2006 | Kumakura | C30B 25/18 428/98 |
| 2006/0175619 A1 | 8/2006 | Fukuyama et al. | |
| 2006/0240584 A1* | 10/2006 | Fudeta | B82Y 20/00 438/22 |
| 2010/0273318 A1 | 10/2010 | Melnik et al. | |
| 2012/0156863 A1 | 6/2012 | Melnik et al. | |
| 2012/0295428 A1 | 11/2012 | Melnik et al. | |
| 2012/0319162 A1* | 12/2012 | Araki | H01L 21/0237 257/103 |

FOREIGN PATENT DOCUMENTS

| | | |
|---|---|---|
| CN | 101689594 A | 3/2010 |
| CN | 101874306 A | 10/2010 |
| CN | 102005523 A | 4/2011 |
| DE | 10034263 A1 | 1/2002 |
| EP | 2200099 A1 | 6/2010 |
| EP | 2544250 A1 | 1/2013 |
| JP | H10247626 | 9/1998 |
| JP | 2005350321 A | 12/2005 |
| JP | 2006004970 A | 1/2006 |
| JP | 2007258258 A | 10/2007 |
| JP | 2009081406 A | 4/2009 |
| JP | 2011077499 A | 4/2011 |
| WO | WO-2005015618 A1 | 2/2005 |
| WO | 2011/108422 A1 | 9/2011 |

* cited by examiner

EPITAXY SUBSTRATE, METHOD FOR PRODUCING AN EPITAXY SUBSTRATE AND OPTOELECTRONIC SEMICONDUCTOR CHIP COMPRISING AN EPITAXY SUBSTRATE

An epitaxy substrate, a method for producing an epitaxy substrate and an optoelectronic semiconductor chip comprising an epitaxy substrate are provided.

Semiconductor materials based on a group III nitride material are generally deposited heteroepitaxially on non-native substrates, for example sapphire ($Al_2O_3$). According to the current prior art, at the start of the heteroepitaxy process a nucleation layer consisting of a group III nitride material, in particular AlN or GaN, is conventionally deposited, on which in turn the desired group III nitride layer structure, for example for a light-emitting diode (LED), is epitaxially grown. The nucleation layer is conventionally deposited epitaxially on the non-native substrate at temperatures of more than 450° C. and less than 690° C. Before the growth of the nucleation layer, a thermal cleaning step is typically also carried out on the substrate.

Conventionally, both the nucleation layer and the subsequent layer structure are deposited by means of metalorganic vapor phase epitaxy (MOVPE). In this case, in particular, problems may arise in controlling the following parameters: temperature, layer thickness, interactions with the substrate surface, interactions with the resorption phase in the case of thermal cleaning before the epitaxy of the nucleation layer, recrystallization step after the epitaxy of the nucleation layer.

Furthermore, very time-consuming temperature adjustments, so-called temperature ramps, are necessary in order to adjust the process temperature between the thermal cleaning step taking place at high temperature and the deposition of the nucleation layer at a significantly lower temperature, as well as between the deposition of the nucleation layer and the growth of the desired group III nitride layer sequence, which likewise takes place at a significantly higher temperature. By means of in-situ monitoring such as pyrometry and reflectometry, attempts are made during the MOVPE process to determine the surface temperature and the growth rate during the growth of the nucleation layer, although this is technically difficult.

Undesired variations in the nucleation layer and during the thermal cleaning, due to variations in the non-native substrates used, are however conventionally tolerated. These need to be determined experimentally and minimized, or optimized.

As an alternative to applying the nucleation layer by means of MOVPE, the deposition of a nucleation layer consisting of AlN by means of sputtering is also known from U.S. Pat. No. 6,692,568 B2, for example.

At least one object of particular embodiments is to provide an epitaxy substrate for a nitride compound semiconductor material. Further objects of particular embodiments are to provide a method for producing an epitaxy substrate and an optoelectronic semiconductor chip comprising an epitaxy substrate.

These objects are achieved by the subject-matter and methods according to the independent patent claims. Advantageous embodiments and refinements of the subject-matter and of the method are characterized in the dependent claims and will be discussed further in the following description and the drawings.

According to at least one embodiment, an epitaxy substrate comprises a nucleation layer. The epitaxy substrate, which may also be referred to as a so-called quasi-substrate, and which in particular comprises a substrate on which at least the nucleation layer is arranged, is used as a growth substrate for a semiconductor layer sequence of a nitride compound semiconductor material. The substrate, which may for example comprise or consist of sapphire, silicon or SiC, is in turn in particular used as a growth substrate for the nucleation layer, which is applied directly on the substrate. In particular, the substrate of the epitaxy substrate described here may therefore be a so-called non-native substrate, which does not comprise nitride compound semiconductor material. The nucleation layer in turn provides a surface on which the semiconductor layer sequence of the nitride compound semiconductor material can be grown by an epitaxy method, for example MOVPE or MBE (molecular beam epitaxy), for example in order to produce an optoelectronic semiconductor chip.

Terms such as "GaN-based materials", "(In,Al,Ga)N-based compound semiconductor materials" and "nitride compound semiconductor materials" include in particular such ones which comprise a material of the III-V compound semiconductor material system $In_xAl_yGa_{1-x-y}N$ with $0 \leq x \leq 1$, $0 \leq y \leq 1$ and $x+y \leq 1$, i.e. for example GaN, AlN, AlGaN, InGaN, AlInGaN.

The nucleation layer comprises at least one first layer which is aluminum oxynitride (AlON) and which has a column structure. The first layer of the nucleation layer, consisting of AlON, is applied directly on the substrate. The column structure may, in particular, be formed in such a way that the first layer of the nucleation layer comprises columns that extend away from the substrate. The columns of the column structure may provide crystal surfaces on which further layers, in particular semiconductor layers consisting of a nitride compound semiconductor material, can be applied with a high crystal quality.

In a method for producing an epitaxy substrate for a nitride compound semiconductor material, the substrate is provided. In a further method step, the nucleation layer comprising the at least one first layer consisting of AlON is applied directly onto a surface of the substrate.

The features and embodiments described below apply equally for the epitaxy substrate and for the method for producing the epitaxy substrate.

According to another embodiment, the nucleation layer, and in particular the first layer consisting of AlON, is applied at a temperature greater than or equal to 700° C. and less than or equal to 1000° C. The upper temperature limit of about 1000° C. represents a critical limit, since a semiconductor layer which is applied at a temperature of more than 1000° C. is no longer formed as a nucleation layer. A temperature which is greater than or equal to 800° C. may be preferred. Furthermore, a temperature which is less than or equal to 900° C. may be particularly suitable. In particular, a temperature which is greater than or equal to 825° C. and/or which is less than or equal to 875° C. may be particularly preferred i.e. for instance a temperature in the range of +/−25° C. around 850° C. The at least one first layer of the nucleation layer, consisting of AlON with the column structure, may be deposited at the described temperature preferably by means of MOVPE and particularly preferably by means of sputtering. As an alternative to this, MBE, hydride vapor phase epitaxy (HVPE), chemical vapor deposition (CVD) or atomic layer deposition (ALD) are also possible.

Unlike in the case of known nucleation layers consisting of (Al,In,Ga)N, which are deposited at low temperatures, so-called low-temperature nucleation layers, in the method described here the nucleation layer is applied at a significantly higher temperature. The long temperature ramps described above, which are difficult to control, and which are necessary because of the different temperature ranges for the various method steps before and after the application of a low-temperature nucleation layer, can be avoided with the nucleation layer described here. In the method described here, for example, the temperature at which the nucleation layer, and in particular the at least one first layer consisting of AlON with the column structure, is deposited, may differ by less than 200° C., and preferably by less than 150° C., from the temperature at which further layers are deposited on the nucleation layer.

In order to apply the nucleation layer, and particularly in order to apply the at least one first layer consisting of AlON, a gas source which is based on $N_2$ and/or $H_2$, which is mixed with $O_2$, may for example be used. Furthermore, it is also possible to use $H_2O$ which is added to a carrier gas through a vapor pressure saturator (bubbler), i.e. a so-called $H_2O$ bubbler. Furthermore, it is also possible for example to use a metalorganic gas source which is based on aluminum and contains oxygen, for example diethylaluminumethoxide or a mixture of diethylaluminumethoxide and trimethylaluminum. By controlling the amount of the oxygen-containing gas which is supplied during the method of growing the nucleation layer, in particular the at least one first layer, the oxygen concentration in the at least one first layer consisting of AlON can be controlled.

Furthermore, it is also possible, for example, for the surface of the substrate on which the nucleation layer is applied to be terminated with oxygen. For this purpose, for example, the substrate may be preconditioned in an $O_2$ plasma. Such oxygen termination of the substrate surface leads to growth of AlON even with gas sources which are conventionally used for producing AlN nucleation layers. In particular, a sapphire substrate may be preconditioned with an $O_2$ plasma, since the oxygen termination of the sapphire surface can lead to the growth of AlON especially on the sapphire/AlN interface. Furthermore, it is also possible to apply an aluminum oxide onto the substrate, for example by means of atomic layer deposition, which likewise promotes the formation of AlON.

The above-described sources or methods for providing the oxygen may also be combined with one another, for example surface conditioning with oxygen and the supply of a gas containing oxygen. By conditioning the substrate surface with oxygen and/or applying aluminum oxide onto the surface of the substrate and/or controlling the supplied amount of oxygen or gas containing oxygen, it is possible to control the oxygen content in the at least one first layer consisting of AlON.

According to another embodiment, the column structure of the at least one first layer consisting of AlON has an oxygen content greater than or equal to 0.1% and less than or equal to 30%. The oxygen concentration may vary in the growth direction or from column to column, but it preferably always lies in the range specified. Preferably, the oxygen content of the at least one first layer of the nucleation layer is controlled in such a way that it decreases with an increasing distance from the substrate in the column structure of the at least one first layer of the nucleation layer. The oxygen concentration within the nucleation layer, and particularly within the first layer consisting of AlON, may for example be measured by means of secondary ion mass spectrometry (SIMS).

The at least one first layer consisting of AlON may have the columns of the column structure packed so densely that a quasi-continuous AlON layer is formed. In other words, this means that the at least one first layer may be formed continuously on a side facing toward the substrate, and may comprise columns extending away from the substrate on a side facing away from the substrate. The side facing toward the substrate may for example be formed as an uninterrupted layer, i.e. one without gaps or substantially without gaps. Furthermore, it is also possible for the side of the at least one first layer consisting of AlON facing toward the substrate to comprise gaps, for example air inclusions. If the at least one first layer consisting of AlON is uninterrupted, or at least quasi-uninterrupted, on the side facing toward the substrate, the individual columns are preferably separated from one another only by grain boundaries. They therefore result from the at least one first layer beginning to grow in the form of individual islands, which grow toward one another along the substrate surface and meet one another, while the columns are being formed extending away from the substrate.

The columns of the at least one first layer consisting of AlON have a defect density of typically more than $10^9$ cm$^{-2}$. The crystal defects are predominantly formed by edge dislocations, although a small proportion of screw dislocations may also be possible. Typically, the type of crystal defects in the nucleation layer described here is split into screw and edge dislocations with a ratio of from greater than or equal to 1:5 to less than or equal to 1:100. In comparison with known nucleation layers, in the nucleation layer described here, and particularly in the at least one first layer consisting of AlON, the proportion of screw dislocations in the crystal defects can be kept very low compared with the edge dislocations. This is advantageous in particular because, in contrast to screw dislocations, edge dislocations can be eliminated for example by an SiN layer applied onto the nucleation layer, i.e. they do not continue into the subsequent semiconductor layers. Such an SiN layer is conventionally applied as a continuous layer in which a multiplicity of openings, in which the underlying layer acts as seed surface, are formed.

According to another embodiment, the columns each have a diameter greater than or equal to 5 nm and less than or equal to 200 nm. The columns may preferably have a diameter greater than or equal to 10 nm, and particularly preferably greater than or equal to 20 nm. Furthermore, the columns may preferably have a diameter less than or equal to 100 nm, and particularly preferably less than or equal to 50 nm. In particular, the diameter may be greater than or equal to 20 nm and less than or equal to 50 nm. The columns may furthermore have a height greater than or equal to 0.5 nm and less than or equal to 50 nm. The height of the columns may in this case preferably make up only a part of the overall height of the at least one first layer consisting of AlON, which may for example be greater than or equal to 1 nm and less than or equal to 200 nm. The overall height of the at least one first layer consisting of AlON may preferably be greater than or equal to 5 nm, and particularly preferably greater than or equal to 10 nm. The overall height of the at least one first layer consisting of AlON may furthermore preferably be less than or equal to 100 nm and particularly preferably less than or equal to 50 nm. In particular, the overall height may be greater than or equal to 10 nm and less than or equal to 50 nm. In particular, the columns may taper with an increasing distance from the substrate. The dimensions of the individual columns, i.e. their height and/or their diameter, may vary in the growth direction and/or from column to column.

In the characterization of the nucleation layer by means of high-resolution X-ray diffraction, the combination of a high density of crystal defects in the at least one layer consisting of AlON with the column structure, the specific defect type and the arrangement of the columns leads, in the XRD rocking curve known to the person skilled in the art, or in an omega scan, to the formation of a so-called correlation peak, as described for example in the publication T. Metzger et al., Phys. Status Solidi A 162, 529, 1997. The detection of a correlation peak in an AlON-based layer is a clear indication that the AlON layer in question has a column structure in the sense of the present invention.

According to another embodiment, the nucleation layer comprises at least one second layer on the first layer consisting of AlON. The at least one second layer may preferably comprise AlN or a GaN-based material. In particular, the at least one second layer may cover the first layer in such a way that the second layer follows the column structure of the at least one first layer consisting of AlON, or the second layer covers the column structure of the first layer. Furthermore, it is also possible for a plurality of further layers to be applied in the form of a plurality of second layers on the at least one first layer. The plurality of second layers may comprise the same material or different materials, and may also be deposited alternately and/or repeatedly several times. The layer stack of the at least one first layer consisting of AlON and the at least one second layer, or a multiplicity of second layers, is then used as a whole as a nucleation layer of the epitaxy substrate for the growth of further semiconductor layers based on a nitride compound semiconductor material. The deposition of the at least one second layer, or a plurality of second layers, may be carried out in the same process as the deposition of the at least one first layer consisting of AlON with the column structure. As an alternative to this, the at least one second layer, or the plurality of second layers, may be deposited in one or more separate processes. The deposition technology for the at least one second layer, or the plurality of second layers, may be the same as for the at least one first layer consisting of AlON with the column structure, or different. Preferably, the at least one second layer, preferably consisting of AlN or a GaN-based material, is applied by means of sputtering on the at least one layer consisting of AlON.

According to another embodiment, immediately after the production of the nucleation layer, a further layer is applied thereon without an annealing step being necessary. The further layer may for example be a layer of the semiconductor layer sequence of a nitride compound semiconductor material to be grown on the epitaxy substrate, a buffer layer or an SiN layer. In the case of known low-temperature nucleation layers, conversely, annealing steps are necessary immediately after the application of a nucleation layer, in order to achieve recrystallization of the nucleation layer. Only by recrystallization can suitable surfaces, or suitable crystal faces, for the growth of further semiconductor layers be provided in the prior art, although this is not necessary in the case of the nucleation layer described here.

According to another embodiment, the epitaxy substrate comprises a buffer layer, for example consisting of a GaN-based material, on the nucleation layer. The buffer layer may, for example, serve for overmolding the nucleation layer and for forming an interlayer between the nucleation layer and the semiconductor layer sequence to be applied thereon. In particular, the buffer layer may be deposited at a temperature of more than 1000° C. As already mentioned above, a semiconductor layer which is applied at a temperature of more than 1000° C. no longer forms a nucleation layer.

According to another embodiment, the epitaxy substrate comprises an SiN layer on the nucleation layer, or optionally on a buffer layer above the nucleation layer. The SiN layer may, for example, be deposited by an in-situ method and formed over the surface of the nucleation layer with openings, in which the underlying semiconductor layer is exposed and forms seed points for a further semiconductor layer. As already described above, edge dislocations, which are present in the nucleation layer or possibly in a buffer layer, can be at least partially eliminated by such an in-situ deposited SiN layer.

In the method described here, the process window in terms of layer thickness and temperature of the nucleation layer, and in particular at least one first layer consisting of AlON with the column structure, is improved substantially in comparison with low-temperature nucleation layers. This can be attributed to the availability of oxygen during the application of the nucleation layer, and in particular of the at least one first layer consisting of AlON with the column structure. The oxygen can, in particular, lead to an interaction with the surface of the substrate, for example of a sapphire substrate, so that undesired termination of the substrate surface can be prevented. In this way, an advantage is obtained over conventional AlN nucleation layers and/or GaN nucleation layers. The consequence of this is that the material quality of the subsequently grown epitaxially deposited semiconductor layer sequence, for example of an optoelectronic semiconductor chip, is improved. Studies have shown that these results are reproducible.

According to another embodiment, an optoelectronic semiconductor chip comprises an epitaxy substrate as described here. A semiconductor layer sequence based on a nitride compound semiconductor material, which has an active layer that can generate or detect light during operation of the semiconductor chip, is applied on the epitaxy substrate. The semiconductor layer sequence may, in particular, be applied by means of an MOVPE method.

In particular, the optoelectronic semiconductor chip may be formed as a light-emitting semiconductor chip or as a photodiode chip. As the active region, the semiconductor layer sequence may for example have a conventional pn junction, a double heterostructure, a single quantum well structure (SQW structure) or a multiple quantum well structure (MQW). Besides the active region, the semiconductor layer sequence may comprise further functional layers and functional regions, for instance p- or n-doped charge carrier transport layers, undoped or p- or n-doped confinement, cladding or waveguide layers, barrier layers, planarization layers, buffer layers, protective layers and/or electrodes, and combinations thereof. The structures described here, which relate to the active region or the further functional layers and regions, are known to the person skilled in art particularly in terms of build, function and structure, and will therefore not be explained in more detail at this point.

The growth process may, in particular, take place at the wafer level. In other words, the substrate of the epitaxy substrate may be provided in the form of a wafer, on which the nucleation layer and on top the semiconductor layer sequence are applied over a large area. The epitaxy substrate with the grown semiconductor layer sequence may in a further method step be separated into individual semiconductor chips, in which case the side surfaces of the semiconductor chips may be formed by the separation.

Furthermore, before the separation, the semiconductor layer sequence may be transferred onto a carrier substrate and at least the substrate of the epitaxy substrate may be thinned, i.e. at least partially or fully removed.

Figure 2:
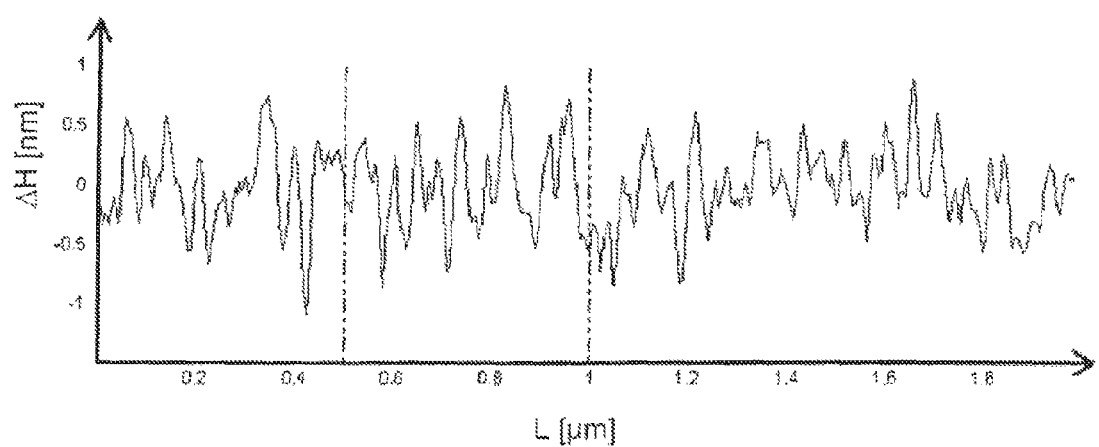
Figure 3:
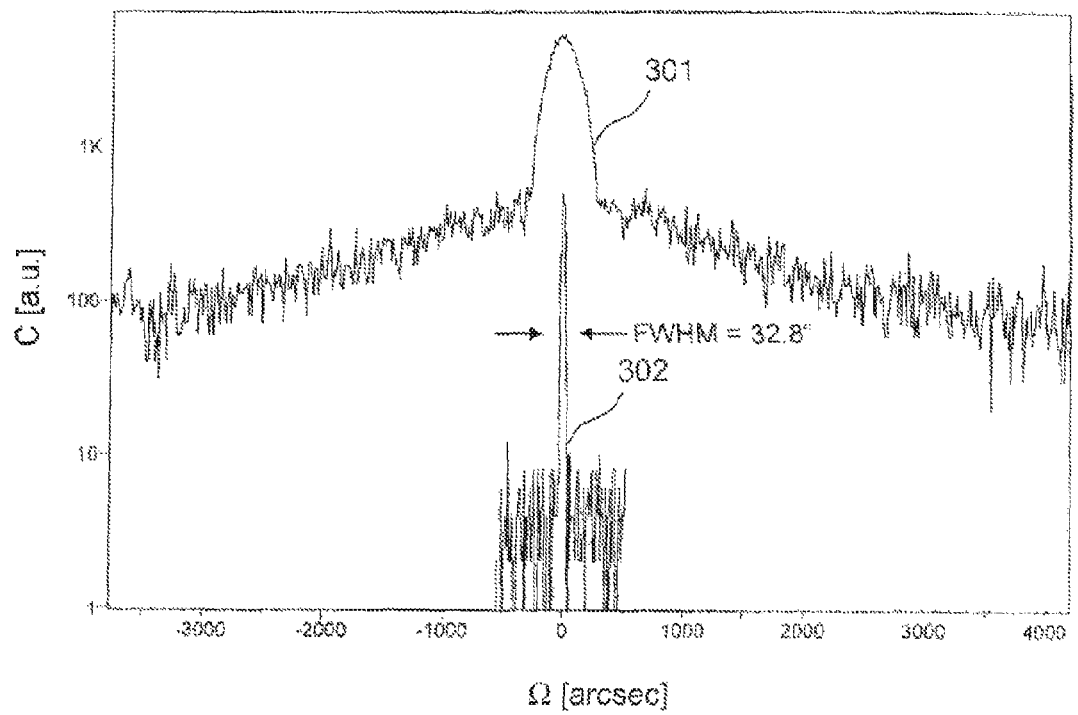
Figure 4:
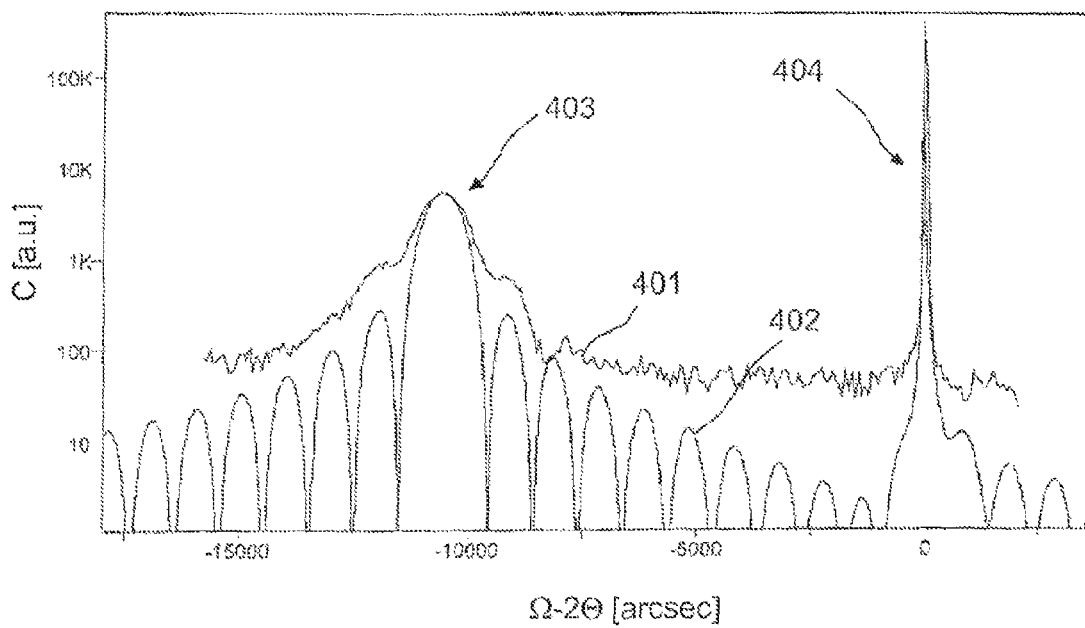
Figure 5:
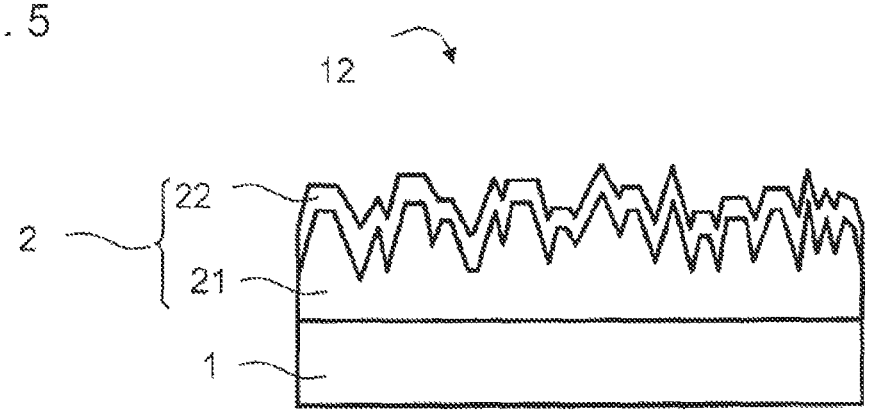
Figure 6:
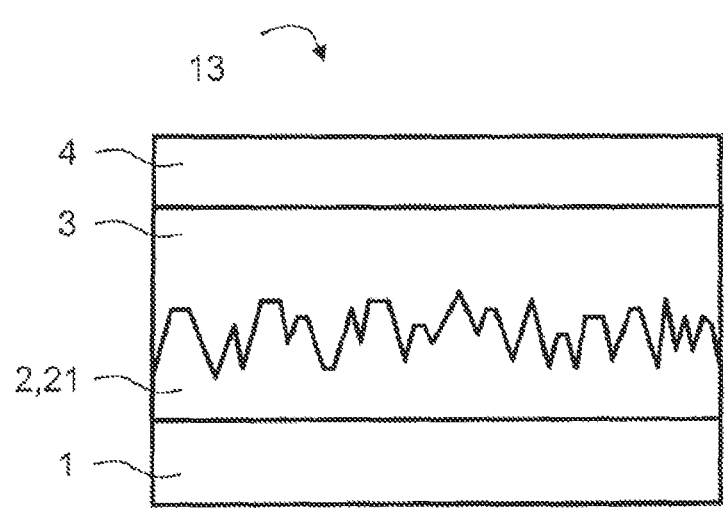
Figure 7:
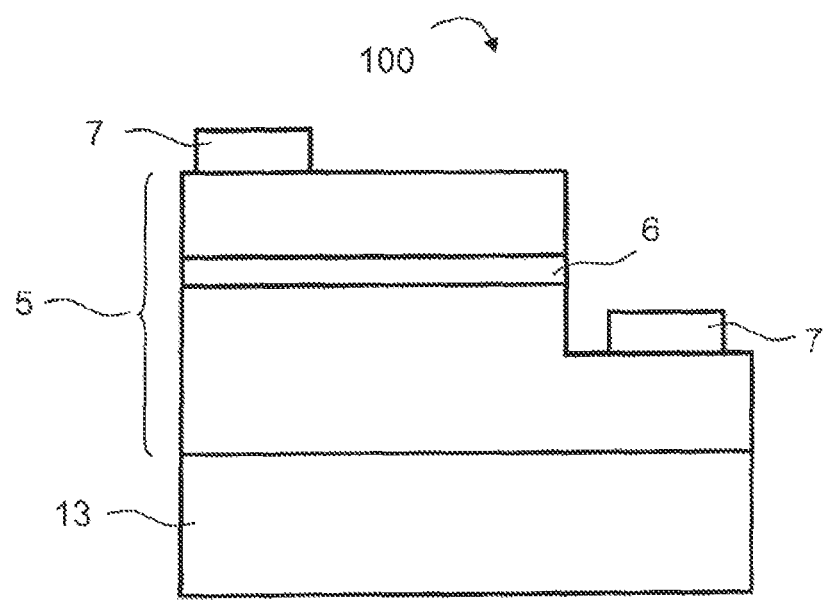

Other advantages, advantageous embodiments and refinements may be found in the following exemplary embodiments described in connection with the figures, in which:

FIG. 1 shows an epitaxy substrate for a nitride compound semiconductor material according to one embodiment, FIGS. 2 to 4 show measurements on nucleation layers according to further exemplary embodiments, FIGS. 5 and 6 show epitaxy substrates according to further exemplary embodiments, and FIG. 7 shows an optoelectronic semiconductor chip comprising an epitaxy substrate according to a further exemplary embodiment.

In the exemplary embodiments and figures, elements which are the same or of the same type, or which have the same effect, may respectively be provided with the same references. The elements represented and their size proportions with respect to one another are not to be regarded as true to scale. Rather, individual elements, for example layers, component parts, component elements and regions, may be represented exaggeratedly large for better representability and/or for better comprehensibility.

FIG. 1 shows an exemplary embodiment of an epitaxy substrate 11.

The epitaxy substrate 11 is provided and formed as a growth substrate for a semiconductor layer sequence, for example an optoelectronic semiconductor chip. To this end, the epitaxy substrate 11 comprises a substrate 1, which in the exemplary embodiment shown is a sapphire substrate, in particular a sapphire wafer. As an alternative to this, the substrate 1 may also for example be an SiC substrate or a silicon substrate. A nucleation layer 2, which in the exemplary embodiment shown is formed by at least one first layer 21 consisting of AlON, is applied on the surface 10 of the substrate 1.

In order to produce the epitaxy substrate 11, the substrate 1 is provided. Before the application of the nucleation layer, the surface 10 may also be cleaned. In an MOVPE system, for example, this may be carried out in a desorption step at about 1080° C. in a pure hydrogen atmosphere. Such a cleaning step may typically last about 5 min. Subsequently, the temperature of the substrate 1 is reduced to a temperature greater than or equal to 700° C. and less than or equal to 1000° C. For example, a temperature of 850° C. has been found to be advantageous for application of the nucleation layer 2 by means of an MOVPE method.

In order to deposit the at least one first layer of the nucleation layer 2, trimethylaluminum and diethylaluminumethoxide are supplied in a desired and expediently selected molar ratio, with the addition of $NH_3$, to the reactor, in which the substrate 1 is at a temperature greater than or equal to 700° C. and less than or equal to 1000° C. A particularly suitable growth temperature may, for example, be 850° C. The at least one first layer 21, consisting of AlON with a column structure, is thereby formed on the surface 10 of the substrate 1. The first layer 21 in this case has a side, facing toward the substrate, which is formed continuously and at least quasi-uninterruptedly, while the side of the at least one first layer 21, facing away from the substrate 1, has the column structure with columns 210 extending away from the substrate 1. It has been found that during a growth time of about 25 min with the temperature described above and the gas sources described above, an AlON layer 21 with a column structure and a height of about 15 nm is formed.

As an alternative or in addition to the described method, a gas source based on $N_2$ and/or $H_2$, which is mixed with $O_2$, may for example be used. It is also possible to supply water as an oxygen source via an $H_2O$ bubbler. Furthermore, it is also possible, for example, for the surface 10 of the substrate 1 to be preconditioned with an $O_2$ plasma. In this way, an oxygen termination of the substrate surface 10 is achieved, which leads to growth of aluminum oxynitride especially on the interface between the substrate 1 and the nucleation layer 2 growing thereon, even when using oxygen-less gas sources. Furthermore, it is also possible to apply aluminum oxide, for example by means of atomic layer deposition, on the substrate surface 10 before the application of the nucleation layer 2, and in particular of the at least one layer 21 consisting of AlON, which likewise promotes the formation of AlON.

By controlled adjustment or variation of the growth parameters, a column structure with columns having a diameter greater than or equal to 5 nm and less than or equal to 200 nm and a height of greater than or equal 0.5 nm and less than or equal to 50 nm can in particular be produced, in which case the dimensions of the individual columns may vary in the growth direction and/or from column to column. Preferably, the columns have a diameter greater than or equal to 10 nm and less than or equal to 100 nm, and particularly preferably greater than or equal to 20 nm and less than or equal to 50 nm. In particular, the columns 210 may also taper with an increasing distance from the substrate 1. The oxygen concentration within the at least one first layer 21 consisting of AlON and preferably within the columns 210 is preferably greater than or equal to 0.1% and less than or equal to 30%, and it may vary in the growth direction and/or from column to column. For example, by reducing the oxygen-containing gas source or sources used during the growth of the at least one first layer 21, a decrease in the oxygen concentration with an increasing distance from the substrate 1 can be achieved.

The columns 210 have typical defect densities greater than $10^9$ $cm^{-2}$, the crystal defects being formed predominantly by edge dislocations. It has been established that the crystal defects are split into screw and edge dislocations in a ratio of from 1:5 to 1:100.

FIG. 2 shows an atomic force microscopy (AFM) measurement of the height-profile of a nucleation layer formed by a first layer 21 as described above, consisting of AlON with a column structure, which was produced by means of the method described above, FIG. 2 showing the height variation ΔH in nanometers around an average height value along a section of length L=2 μm. A 6 inch sapphire substrate with a thickness of 1 mm and a 0001 orientation with 0.3° miscut in the direction of the crystallographic m plane was used as the substrate 1. The nucleation layer applied had a height of about 17 nm with columns that had a height of from 0.5 nm to 2 nm. The nucleation layer surface covered with the columns can be seen clearly in the AFM measurement.

FIG. 3 shows two measurements of such a nucleation layer on the 002 plane of AlN, which were carried out by means of X-ray diffraction (XRD). Measurement 301 is a measurement with so-called rocking curve optics, while measurement 302 was carried out with so-called triple axis optics and therefore with an improved angular resolution but a lower intensity. In particular, measurement 302 shows the typical correlation peak with a full width at half maximum of less than 25 arcsec.

In FIG. 4, curve 401 shows a so-called Ω-2Θ scan with rocking curve optics, peak 403 corresponding to the 002 plane of AlN and peak 404 to the 006 plane of sapphire. Curve 402 is a simulation of a 17 nm thick AlN layer, for which a lattice constant c of 5.01262 nm and a 96.1% relaxed structure were assumed.

FIG. 5 shows another exemplary embodiment of an epitaxy substrate 12, which, in contrast to the epitaxy substrate 11 of FIG. 1, comprises a nucleation layer 2 that has at least one second layer on the at least one first layer 21 consisting of AlON with the column structure. The at least one second layer 22, which may be deposited in the same process as the first layer 21 or in a separate process, comprises AlN in the exemplary embodiment shown. Preferably, the second layer 22 is applied on the first layer 21 by means of sputtering. The second layer 22 in this case covers the first layer 21 and at least partially continues the column structure of the first layer 21. As an alternative to this, it may also be possible for the at least one second layer 22 to cover the first layer 21 in such a way that the column structure of the first layer 21 is planarized. The deposition of the at least one second layer 22 is preferably carried out at a similar temperature as the growth of the first layer 21, in particular at a temperature greater than or equal to 700° C. and less than or equal to 1000° C.

Furthermore, it is also possible for a multiplicity of second layers to be deposited on the at least one first layer 21 consisting of AlON with the column structure. The additional layers may also be deposited alternately or repeatedly several times, the entire layer stack consisting of the at least one first layer 21 and the further second layers 22 forming the nucleation layer 2.

FIG. 6 shows another exemplary embodiment of an epitaxy substrate 13, which in contrast to the epitaxy substrate 11 of FIG. 1 comprises a buffer layer 3, in the exemplary embodiment shown consisting of undoped GaN, on the nucleation layer 2. The column structure of the at least one layer 21 consisting of AlON is grown over by means of the buffer layer 3 at a temperature which is more than 1000° C., and therefore about 150° C. higher than the growth temperature of the nucleation layer 2. A layer 4 of in-situ deposited SiN is applied over the buffer layer 3 for defect reduction. The SiN layer 4 typically comprises openings (not shown), in which the buffer layer 3 exposed underneath forms seed regions for a semiconductor layer sequence applied on top. As an alternative to this, it may also be possible for an SiN layer to be applied directly on the nucleation layer 2.

FIG. 7 shows an exemplary embodiment of an optoelectronic semiconductor chip 100, which purely by way of example comprises the epitaxy substrate 13 of the exemplary embodiment of FIG. 6. As an alternative to this, the epitaxy substrate may also be formed by one of the epitaxy substrates 11, 12 described above. A semiconductor layer sequence 5 of a nitride compound semiconductor material, which comprises an active layer 6 for emission or detection of light, is applied on the epitaxy substrate 13 by means of an MOVPE method. Correspondingly, the optoelectronic semiconductor chip 100 is formed as a light-emitting semiconductor chip or as a photodiode chip.

The semiconductor layer sequence 5, and in particular the active region 6, may be contacted via electrical contacts 7 shown by way of example. The semiconductor layer sequence 5 and the active region 6 may, for example, be configured as described in the general part.

By virtue of the nucleation layer 2 of the epitaxy substrates 11, 12, 13 described here, which can be applied at higher temperatures than known low-temperature nucleation layers, it is possible to avoid long and difficult to control temperature ramps, which are necessary in the prior art in order to adapt the temperature between the application step for the nucleation layer and the method steps carried out before this and the method step carried out after this. In this way, the process window in terms of layer thickness and temperature of the AlON column structure, described here, as a nucleation layer can be improved substantially in comparison with low-temperature nucleation layers. The oxygen which is used during the growth of the at least one first layer 21 of the nucleation layer 2 leads to an interaction with the substrate surface, for example with the sapphire surface in the case of a sapphire substrate, which avoids undesired termination of the sapphire surface. As a consequence of this, the material quality of the subsequently epitaxially grown semiconductor layer sequence, based on a nitride compound semiconductor material, can be improved.

The exemplary embodiments and features described in the figures may also be combined with one another. In addition or as an alternative to the features presented in the exemplary embodiments, the epitaxy substrates described in connection with the figures, the production methods for these and the optoelectronic semiconductor chip may also have further features according to the description in the general part.

By the description with the aid of exemplary embodiments, the invention is not restricted to these exemplary embodiments. Rather, the invention covers any new feature and any combination of features, which includes in particular any combination of features in the patent claims, even if this feature or this combination is not explicitly indicated per se in the patent claims or in the exemplary embodiments.

This patent application claims the priority of the German patent Application 10 2012 103686.1, the disclosure content of which is hereby incorporated by reference.

The invention claimed is:

1. An epitaxy substrate for a nitride compound semiconductor material,
    having a nucleation layer directly on a substrate,
    wherein the nucleation layer comprises at least one first layer consisting of AlON with a column structure,
    wherein an SiN layer is applied on the nucleation layer, and
    wherein the column structure has an oxygen content which decreases with an increasing distance from the substrate.

2. The epitaxy substrate according to claim 1, wherein the first layer is formed continuously on a side facing toward the substrate and comprises columns extending from the substrate on a side facing away from the substrate.

3. The epitaxy substrate according to claim 2, wherein the columns each have a diameter greater than or equal to 5 nm and less than or equal to 200 nm, and a height greater than or equal to 0.5 nm and less than or equal to 50 nm.

4. The epitaxy substrate according to claim 2, wherein the columns are separated from one another by grain boundaries on the side of the first layer facing toward the substrate.

5. The epitaxy substrate according to claim 2, wherein the columns have a defect density greater than $10^9$ cm$^{-2}$.

6. The epitaxy substrate according to claim 1, wherein the column structure has an oxygen content greater than or equal to 0.1% and less than or equal to 30%.

7. The epitaxy substrate according to claim 1, wherein the nucleation layer comprises at least one second layer, which comprises AlN or a GaN-based material, on the first layer.

8. The epitaxy substrate according to claim 1, wherein a buffer layer of a GaN-based material and/or an SiN layer is applied on the nucleation layer.

9. The epitaxy substrate according to claim 1, wherein the substrate is a sapphire substrate, a silicon substrate or an SiC substrate.

10. An optoelectronic semiconductor chip (100) comprising an epitaxy substrate according to claim 1, on which a semiconductor layer sequence based on a nitride compound semiconductor material having an active layer, which can generate or detect light during operation of the semiconductor chip, is applied.

11. A method for producing an epitaxy substrate according to claim 1, comprising the steps:
A) providing a substrate
B) applying a nucleation layer comprising at least one first layer consisting of AlON, which has a column structure, directly on the substrate at a temperature greater than or equal to 700° C. and less than or equal to 1000° C.

12. The method according to claim 11, wherein the first layer is applied by means of metalorganic vapor phase epitaxy (MOVPE) in order to form the column structure.

13. The method according to claim 11, wherein the first layer is applied by one or more of the following substeps in method step B:
supplying a gas source which contains $O_2$;
supplying a metalorganic gas source, which is based on aluminum and contains oxygen;
terminating the surface of the substrate facing toward the nucleation layer with oxygen; and
applying aluminum oxide onto the surface of substrate facing toward the nucleation layer.

14. The method according to claim 11, wherein at least one second layer of the nucleation layer, consisting of AlN or a GaN-based material, is applied on the first layer.

15. The method according to claim 14, wherein the second layer of the nucleation layer is sputtered on the first layer.

16. The method according to claim 11, wherein a further layer is applied immediately after the production of the nucleation layer, without an annealing step carried out in-between.

17. An epitaxy substrate for a nitride compound semiconductor material,
having a nucleation layer directly on a substrate,
wherein the nucleation layer comprises a first layer consisting of AlON with a column structure,
wherein an SiN layer is applied on the nucleation layer,
wherein the column structure has an oxygen content which decreases with an increasing distance from the substrate,
wherein the first layer is formed continuously on a side facing toward the substrate and comprises columns extending away from the substrate,
wherein the dimensions of the columns vary in growth direction, and
wherein the columns have a diameter greater than or equal to 20 nm and less than or equal to 50 nm.

* * * * *